(12) United States Patent
Takahashi

(10) Patent No.: US 11,740,285 B2
(45) Date of Patent: Aug. 29, 2023

(54) SEMICONDUCTOR INTEGRATED CIRCUIT DEVICE AND OPERATING METHOD THEREOF

(71) Applicant: KIOXIA CORPORATION, Tokyo (JP)

(72) Inventor: Yuusuke Takahashi, Kamakura Kanagawa (JP)

(73) Assignee: Kioxia Corporation, Tokyo (JP)

( * ) Notice: Subject to any disclaimer, the term of this patent is extended or adjusted under 35 U.S.C. 154(b) by 59 days.

(21) Appl. No.: 17/410,744

(22) Filed: Aug. 24, 2021

(65) Prior Publication Data

US 2022/0236324 A1 Jul. 28, 2022

(30) Foreign Application Priority Data

Jan. 28, 2021 (JP) ................. 2021-011674

(51) Int. Cl.
| | | |
|---|---|---|
| *G01R 31/3177* | (2006.01) | |
| *G01R 31/317* | (2006.01) | |
| *G01R 31/3183* | (2006.01) | |
| *G01R 31/3187* | (2006.01) | |
| *G01R 31/3181* | (2006.01) | |

(Continued)

(52) U.S. Cl.
CPC ..... *G01R 31/3177* (2013.01); *G01R 31/3183* (2013.01); *G01R 31/3187* (2013.01); *G01R 31/3193* (2013.01); *G01R 31/31703* (2013.01); *G01R 31/31724* (2013.01); *G01R 31/31727* (2013.01); *G01R 31/31813* (2013.01); *G01R 31/31932* (2013.01); *G01R 31/31935* (2013.01); *H01L 22/34* (2013.01)

(58) Field of Classification Search
CPC ........ G01R 31/31724; G01R 31/31727; G01R 31/31932; G01R 31/31935; G01R 31/3177; G01R 31/31813; G01R 31/3183; G01R 31/3187; G01R 31/31703; G01R 31/3193; H01L 22/34
USPC ....... 714/718, 719, 720, 724, 728, 731, 733, 714/735, 736, 738, 739, 742, 744
See application file for complete search history.

(56) References Cited

U.S. PATENT DOCUMENTS

| | | | |
|---|---|---|---|
| 5,640,509 A | 6/1997 | Balmer et al. | |
| 5,642,317 A * | 6/1997 | Furutani | G11C 29/38 365/201 |
| 5,912,901 A | 6/1999 | Adams et al. | |

(Continued)

FOREIGN PATENT DOCUMENTS

| | | |
|---|---|---|
| JP | H09127206 A | 5/1997 |
| JP | H11344535 A | 12/1999 |

(Continued)

*Primary Examiner* — John J Tabone, Jr.
(74) *Attorney, Agent, or Firm* — Kim & Stewart LLP

(57) ABSTRACT

According to one or more embodiments, the semiconductor integrated circuit device includes a pattern generator, a result comparator, and a control circuit. The pattern generator supplies input data to a device-under-test. The result comparator compares output data of the device-under-test with expected value data and outputs a test result signal. The control circuit controls the pattern generator and the result comparator. The device-under-test and the result comparator are commonly connected to a first clock line. The pattern generator and the control circuit are commonly connected to a second clock line different from the first clock line.

13 Claims, 16 Drawing Sheets

(51) Int. Cl.
*H01L 21/66* (2006.01)
*G01R 31/3193* (2006.01)

(56) References Cited

U.S. PATENT DOCUMENTS

| | | | | |
|---|---|---|---|---|
| 6,631,486 | B1* | 10/2003 | Komatsu | G01R 31/31905 714/724 |
| 7,765,449 | B2* | 7/2010 | Doi | G11C 16/0483 714/719 |
| 7,805,641 | B2* | 9/2010 | Yamada | G01R 31/31726 714/742 |
| 8,111,082 | B2* | 2/2012 | Negishi | G01R 31/31703 324/762.01 |
| 8,373,433 | B2* | 2/2013 | Washizu | G01R 31/31922 714/744 |
| 8,502,523 | B2* | 8/2013 | Yamada | G01R 31/31922 714/744 |
| 8,719,650 | B2 | 5/2014 | Matsuo | |
| 2003/0191998 | A1* | 10/2003 | Nakamura | G01R 31/3187 714/733 |
| 2004/0193991 | A1* | 9/2004 | Tanaka | G01R 31/31727 714/742 |
| 2006/0282731 | A1* | 12/2006 | Sawai | G01R 31/31703 714/731 |
| 2007/0022346 | A1* | 1/2007 | Nishimine | G01R 31/31932 714/734 |
| 2007/0091497 | A1* | 4/2007 | Mizuno | G11B 20/1816 714/E11.163 |
| 2008/0022176 | A1* | 1/2008 | Anzou | G11C 29/16 714/733 |
| 2008/0077831 | A1* | 3/2008 | Sasaki | G11C 29/18 714/720 |
| 2008/0141089 | A1* | 6/2008 | Maeda | G01R 31/31713 714/E11.169 |
| 2009/0115443 | A1 | 5/2009 | Lai et al. | |
| 2010/0107026 | A1* | 4/2010 | Nakamura | G01R 31/31726 714/E11.002 |
| 2010/0148815 | A1* | 6/2010 | Tabata | G11C 29/56 324/750.3 |
| 2010/0182857 | A1* | 7/2010 | Arai | G11C 29/56 365/194 |
| 2010/0207640 | A1* | 8/2010 | Washizu | G01R 31/31928 324/537 |
| 2013/0200931 | A1* | 8/2013 | Kono | H03L 7/06 327/147 |
| 2014/0289576 | A1 | 9/2014 | Maekawa | |
| 2017/0192057 | A1 | 7/2017 | Bhamidipati et al. | |
| 2018/0277237 | A1* | 9/2018 | Maeda | G11C 29/20 |
| 2022/0236324 | A1* | 7/2022 | Takahashi | G01R 31/3177 |

FOREIGN PATENT DOCUMENTS

| | | |
|---|---|---|
| JP | 2004061114 A | 2/2004 |
| JP | 5608409 B2 | 10/2014 |
| JP | 5727358 B2 | 6/2015 |
| TW | I435096 B | 4/2014 |

* cited by examiner

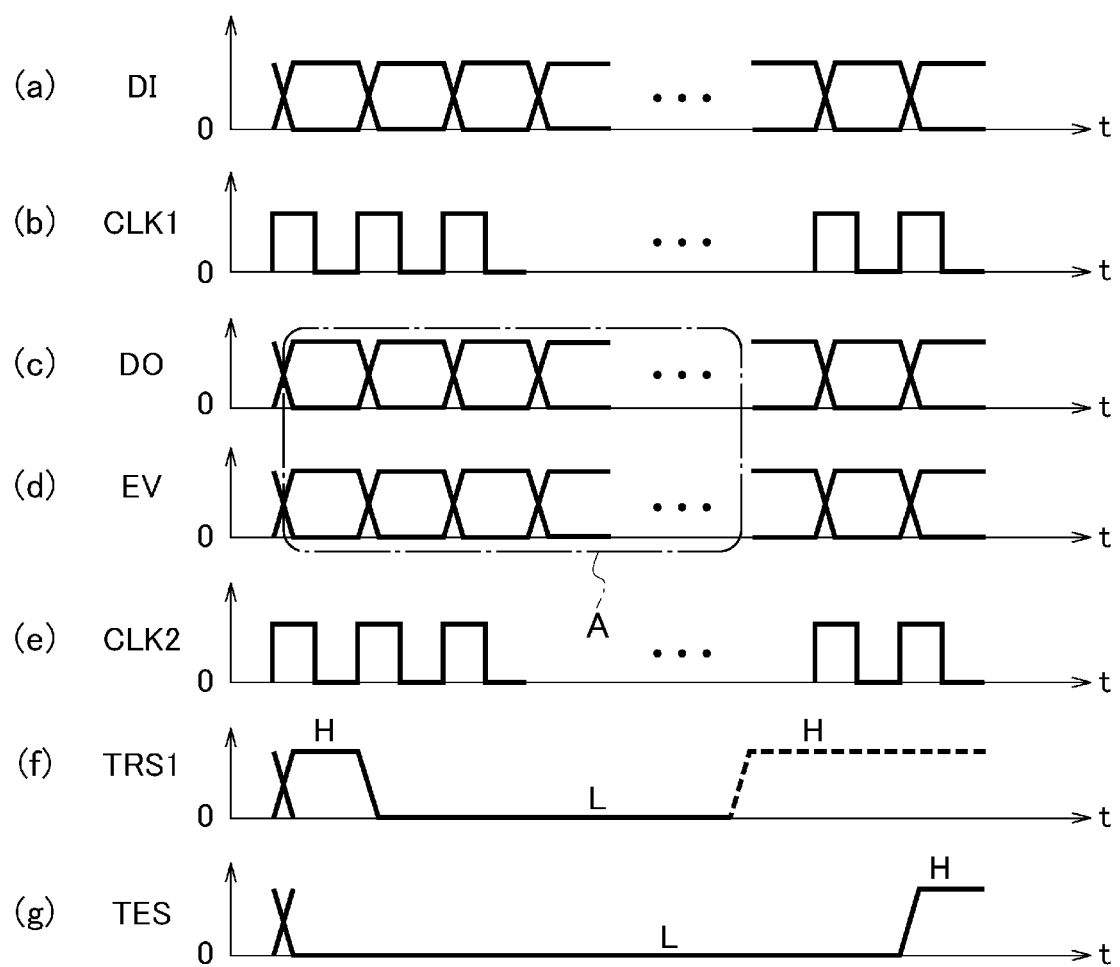

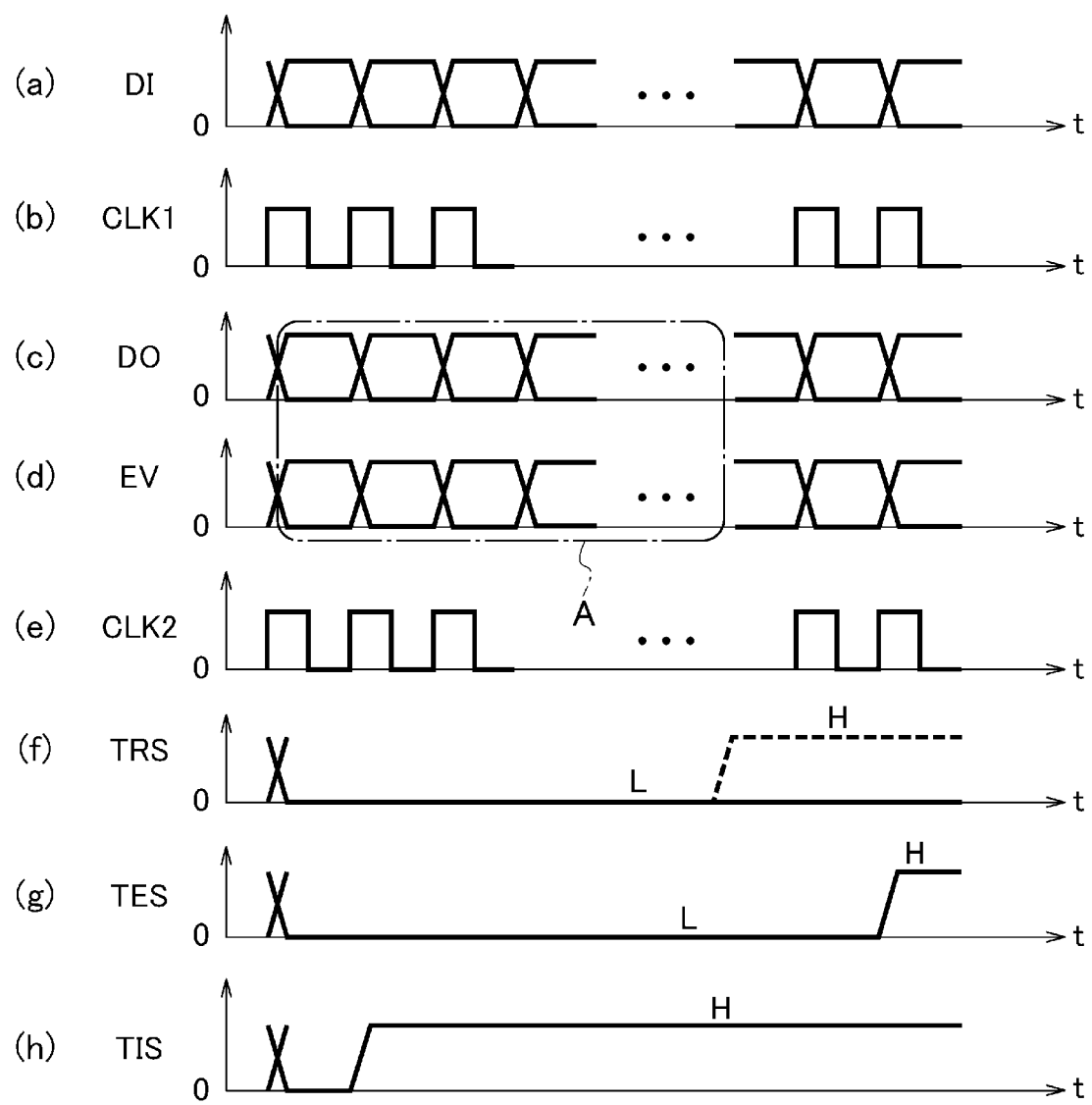

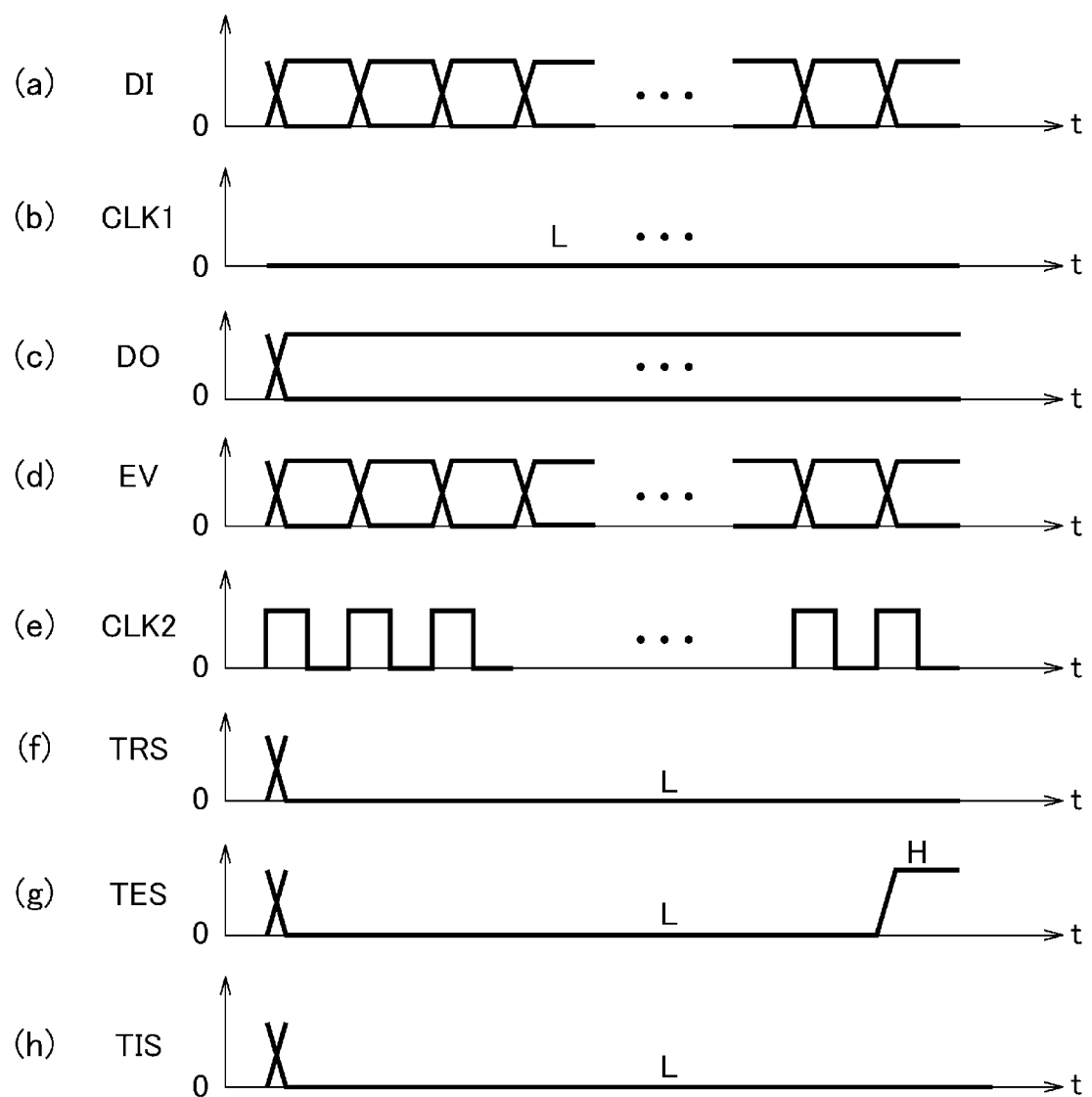

SEMICONDUCTOR INTEGRATED CIRCUIT DEVICE AND OPERATING METHOD THEREOF

CROSS-REFERENCE TO RELATED APPLICATION

This application is based upon and claims the benefit of priority from Japanese Patent Application No. 2021-011674, filed Jan. 28, 2021, the entire contents of which are incorporated herein by reference.

FIELD

Embodiments described herein relate generally to a semiconductor integrated circuit device and an operating method thereof.

BACKGROUND

In general, a built-in self-test (BIST) circuit is used for testing various circuits, such as memory circuits, logic circuits, and analog circuits. Examples of memory circuits to be tested with a BIST circuit include but are not limited to a static random-access memory (SRAM), a read-only memory (ROM), a dynamic random-access memory (DRAM), and the like. Examples of logic circuits to be tested with a BIST circuit include but are not limited to random logic, processor logic, and the like. Examples of analog circuits to be tested with a BIST circuit include but are not limited to a phase-locked loop (PLL), an analog-to-digital or digital-to-analog (AD/DA) converter, and the like.

BRIEF DESCRIPTION OF THE DRAWINGS

FIG. 5A is an operation timing chart of a semiconductor integrated circuit device in normal operation according to a first embodiment.

FIG. 7A is an operation timing chart of a semiconductor integrated circuit device in normal operation according to a second embodiment.

FIG. 9B is an operation timing chart of a semiconductor integrated circuit device in a case where a clock line of a device-under-test (DUT) fails according to a third embodiment.

DETAILED DESCRIPTION

Figure 1:
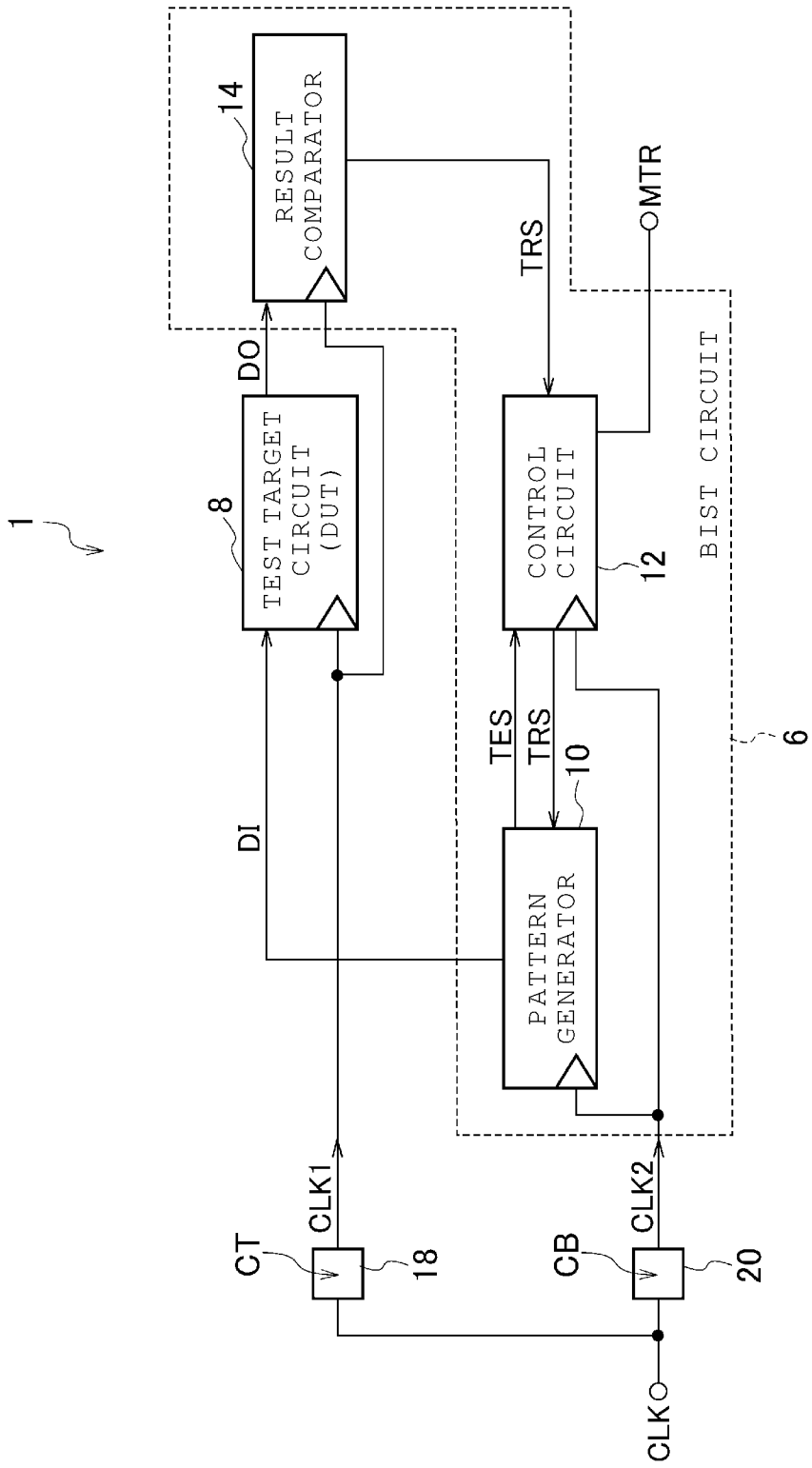
FIG. 1 is a block diagram of a semiconductor integrated circuit device according to a comparative example.

Embodiments provide a semiconductor integrated circuit device capable of avoiding test omissions by a BIST circuit and an operation method of a semiconductor integrated for avoiding test omissions by a BIST circuit.

In general, according to one embodiment, the semiconductor integrated circuit device includes a pattern generator, a result comparator, and a control circuit. The pattern generator supplies input data to a device-under-test. The result comparator compares output data of the device-under-test with expected value data and outputs a test result signal. The control circuit controls the pattern generator and the result comparator. The device-under-test and the result comparator are commonly connected to a first clock line. The pattern generator and the control circuit are commonly connected to a second clock line different from the first clock line.

Hereinafter, some example embodiments will be described with reference to the accompanying drawings. Substantially similar components, elements, aspects, or the like are designated by the same reference numerals, and descriptions thereof may be omitted after an initial description. The drawings are schematic. The depicted embodiments exemplify devices and methods for embodying technical concepts of the present disclosure. The details of the described embodiments can be modified in various ways and still remain within the scope of the present disclosure. In the following description, the language "a test omission of BIST circuit" means that in a semiconductor integrated circuit device including a BIST circuit, the BIST circuit incorrectly indicates or determines that a test is passed even if no test has been conducted.

(Comparative Example)

FIG. 1 is a block diagram of a semiconductor integrated circuit device 1 according to a comparative example.

As shown in FIG. 1, the semiconductor integrated circuit device 1 includes a built-in self-test (BIST) circuit 6 that tests a test target circuit referred to as a device-under-test (DUT) 8.

The BIST circuit 6 includes a pattern generator 10, a control circuit 12, and a result comparator 14. A first clock control unit ("CT 18") of the semiconductor integrated circuit device 1 controls a first clock signal CLK1 that is input in common to both the DUT 8 and the result comparator 14 in the BIST circuit 6. A second clock control unit 20 ("CB 20") controls a second clock signal CLK2 that is input in common to both the pattern generator 10 and the control circuit 12. A test of the DUT 8 by the BIST circuit 6 is determined by two signals, a test result signal TRS, which is a pass/fail determination signal, and a test end signal TES. The test result signal TRS indicates whether there is a problem in the DUT 8 that was tested (a test target). The test end signal TES indicates whether the test has been executed to the end (completed).

The control circuit 12 controls the testing of DUT 8, and the pattern generator 10, and the result comparator 14 during BIST execution (testing). The control circuit 12 may be connected to a monitor terminal MTR for observing signals from the result comparator 14, such as the test end signal TES and the test result signal TRS. The result comparator 14 outputs the test result signal TRS. At the end of the test, the control circuit 12 determines that there is no problem in the DUT 8 if the test result signal TRS is a low level L and determines that there is a problem in the DUT 8 if the test result signal TRS is a high level H.

The pattern generator 10 is a circuit that generates input data DI to be input to the DUT 8.

In the semiconductor integrated circuit device 1, the DUT 8 and the result comparator 14 are supplied with the first clock signal CLK1, and the pattern generator 10 and the control circuit 12 are supplied with the second clock signal CLK2 via a line (wiring or electrical connection) different from the first clock signal CLK1. The first clock signal CLK1 and the second clock signal CLK2 may have the same timing.

The first clock signal CLK1 and the input data DI are supplied to the DUT 8. Output data DO of the DUT 8 is supplied to the result comparator 14. The test result signal TRS is supplied from the result comparator 14 to the control circuit 12.

Figure 2:
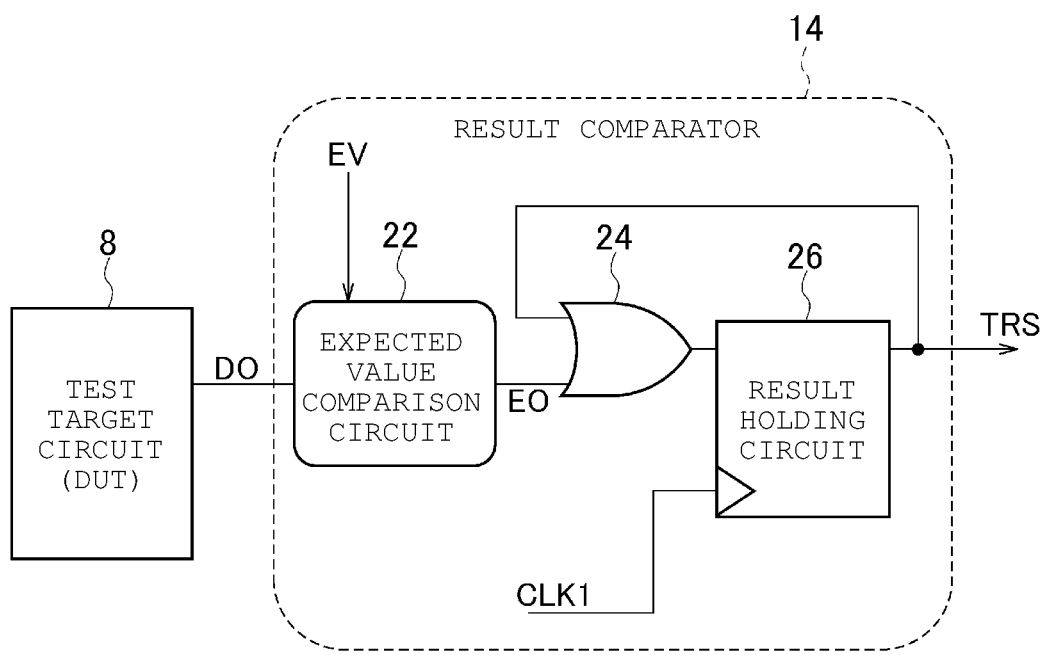
FIG. 2 is a circuit block diagram of a result comparator according to a comparative example.

FIG. 2 is a circuit block diagram of a result comparator 14. The result comparator 14 includes an expected value comparison circuit 22 that can be connected to the DUT 8, an OR gate 24 that is connected to the expected value comparison circuit 22, and a result holding circuit 26 that is connected to the OR gate 24 and whose initial value is a low level L ("0"). The result holding circuit 26 includes, for example, a flip-flop circuit configuration, such as a D-type flip-flop.

The expected value comparison circuit 22 compares the output data DO of the DUT 8 with expected value data EV, and if they match, outputs the low level L ("0" or value zero)) as expected value comparison data EO, and if they do not match, the expected value comparison circuit 22 outputs a high level H ("1" or value one) as the expected value comparison data EO. The expected value comparison data EO is input to the OR gate 24.

The output of the OR gate 24 is input to the result holding circuit 26. The result holding circuit 26 outputs the test result signal TRS in response to the input of the first clock signal CLK1. The output of the OR gate 24 is the OR output of the expected value comparison data EO and the test result signal TRS.

Figure 3A:
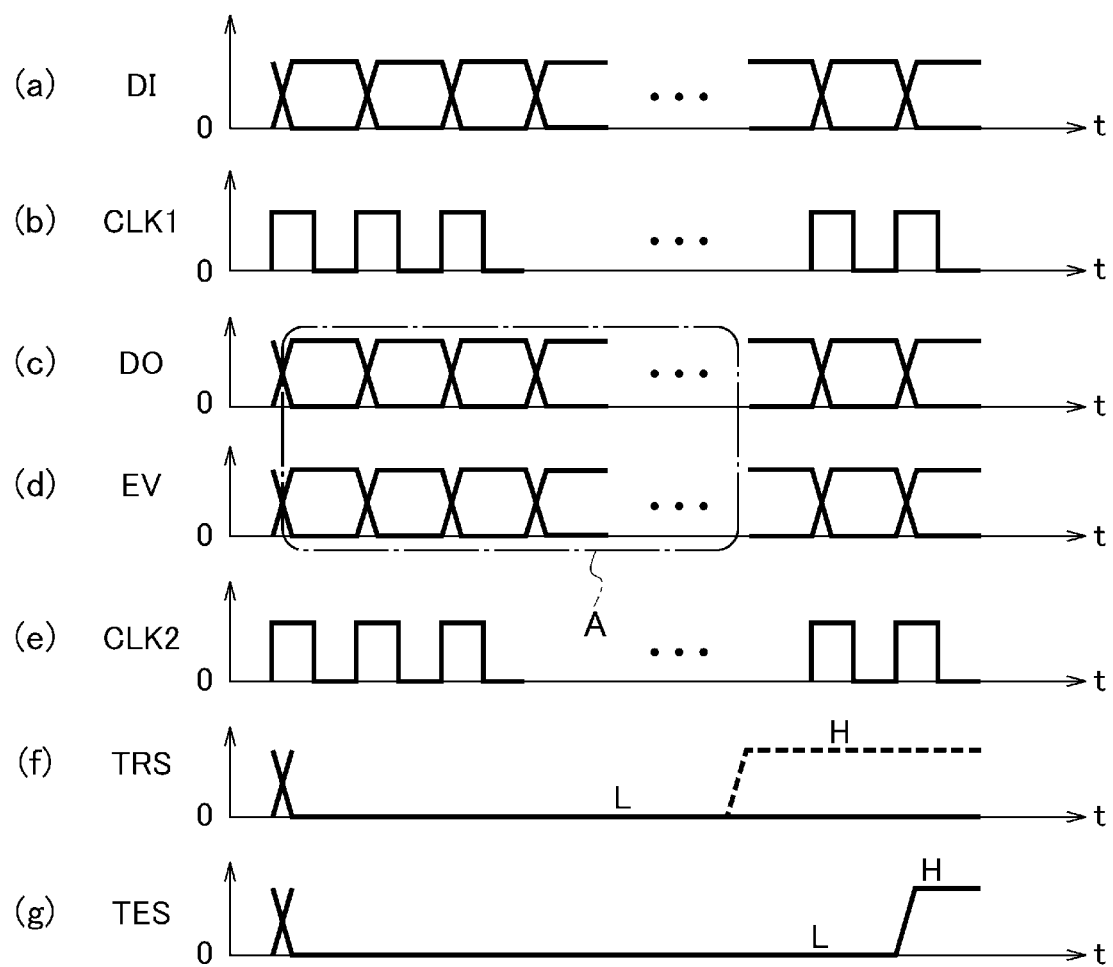
FIG. 3A is an operation timing chart of a semiconductor integrated circuit device according to a comparative example.
Figure 3B:
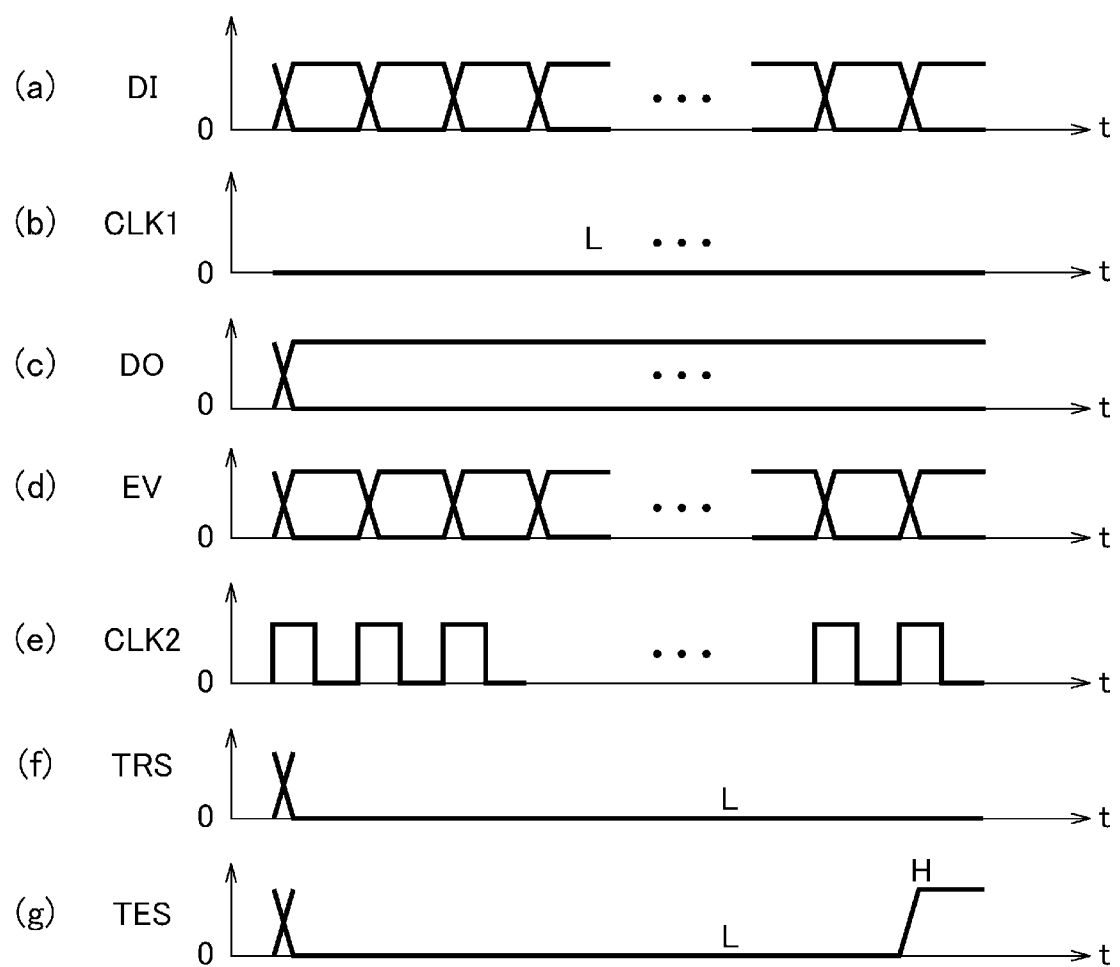
FIG. 3B is an operation timing chart of a semiconductor integrated circuit device in a case where a clock line of a device-under-test (DUT) fails according to a comparative example.

FIG. 3A is an operation timing chart of the semiconductor integrated circuit device 1. FIG. 3B is an operation timing chart in a case where the first clock line to the DUT 8 fails (that is, the first clock signal CLK1 is not actually supplied to the DUT 8, but rather a constant L signal appears to be supplied to the DUT 8).

In FIGS. 3A and 3B, portion (a) indicates the input data DI, portion (b) indicates the first clock signal CLK1 (or apparent first clock signal CLK1), portion (c) indicates the output data DO, portion (d) indicates the expected value data EV, portion (e) indicates the second clock signal CLK2, portion (f) indicates the test result signal TRS, and portion (g) indicates the test end signal TES.

Example when the result comparator 14 operates normally and there is no problem in the DUT 8

(Operation Timing Chart: FIG. 3A)

In the result comparator 14, the output data DO is compared with the expected value data EV for each cycle of the first clock signal CLK1, and the test result signal TRS continues to hold the low level L (as shown by the solid line) while the output data DO of the DUT 8 and the expected value data EV match with each other. The test end signal TES holds the low level L during the test, but it shifts from the low level L to the high level H when the test is completed. The control circuit 12 determines whether there is a problem in the DUT 8 based on the value of the test result signal TRS at the end of the testing. Since the test result signal TRS is the low level L, it is determined that there is no problem in the DUT 8.

Example when the result comparator 14 operates normally and there is a problem in the DUT 8

(Operation Timing Chart: FIG. 3A)

During the period of time when the output data DO of the DUT 8 and the expected value data EV match with each other, the test result signal TRS continues to output the low level L. For example, in the region shown by the broken line A in FIG. 3A. When the output data DO is compared with the expected value data EV and the output data DO of the DUT 8 and the expected value data EV do not match because of a fail, the test result signal TRS becomes the high level H as shown by the broken line and continues to hold this high level H. The test end signal TES holds the low level L during the testing, but it shifts from the low level L to the high level H when the test is completed. The control circuit 12 determines whether there is a problem in the DUT 8 based on the test result signal TRS at the end of the testing. Since the test result signal TRS is the high level H, it is determined that there is a problem in the DUT 8.

Example when the result comparator 14 does not operate normally (When the Clock Line Fails: FIG. 3B)

When the first clock line to the DUT 8 fails, the first clock signal CLK1 to the DUT 8 becomes (or appears to be) the low level L as shown in portion (b) of FIG. 3B. Similarly, the first clock signal CLK1 to the result comparator 14 becomes (or appears to be) the low level L. The operation of the DUT 8 is stopped. As a result, even if the output data DO and the expected value data EV do not match, the result comparator 14 does not operate due to the failure in the first clock line, and thus, the test result signal TRS continues to hold the low level L, which is the initial value. Consequently, even if there is a problem in the DUT 8, it will be determined that there is no problem in the DUT 8. In other words, in the comparative example, even though DUT 8 has not been tested normally, it is considered to have been tested, and thus inadvertent test omissions may occur.

(First Embodiment)

Figure 4A:
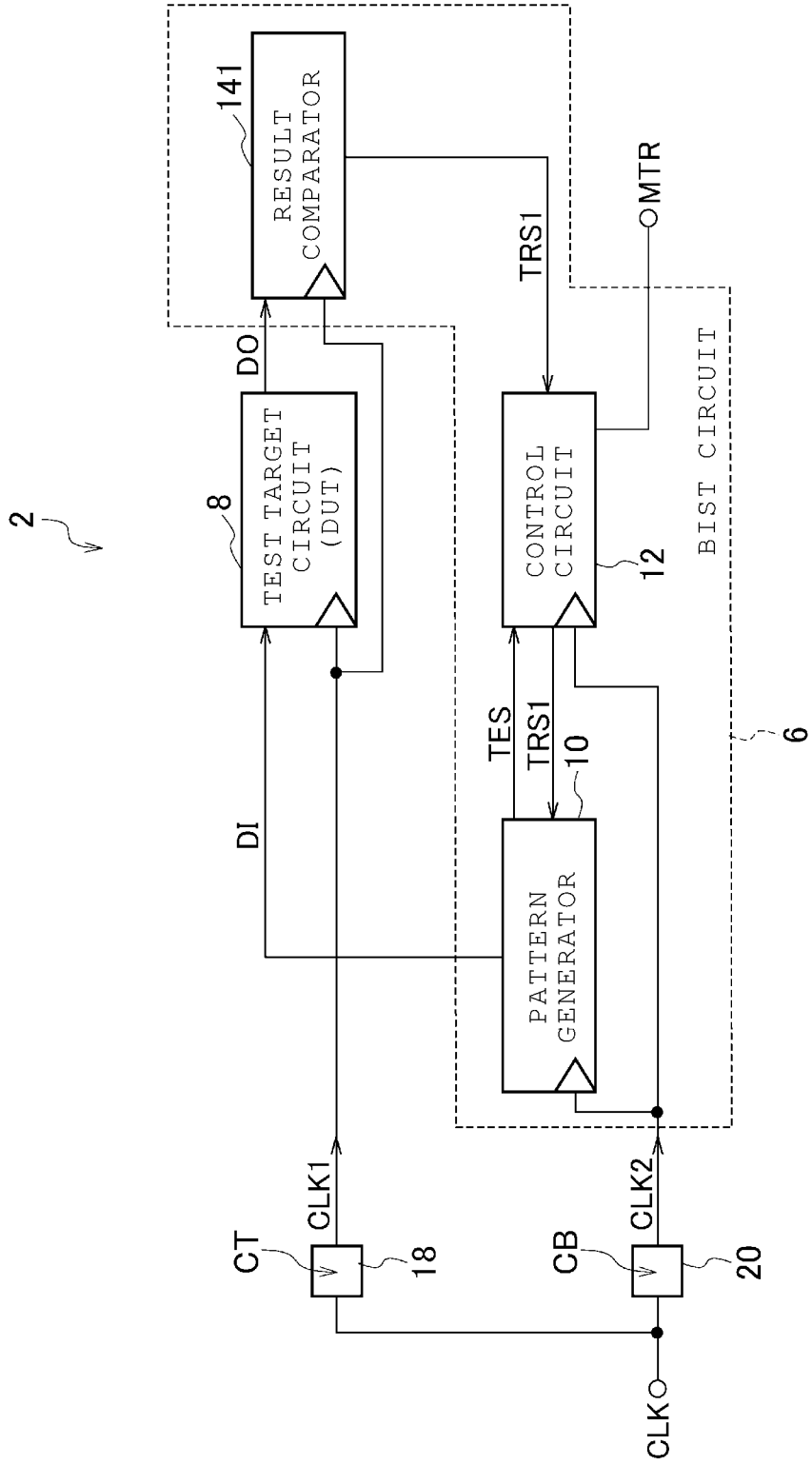
FIG. 4A is a circuit block diagram of a semiconductor integrated circuit device according to a first embodiment.
Figure 4B:
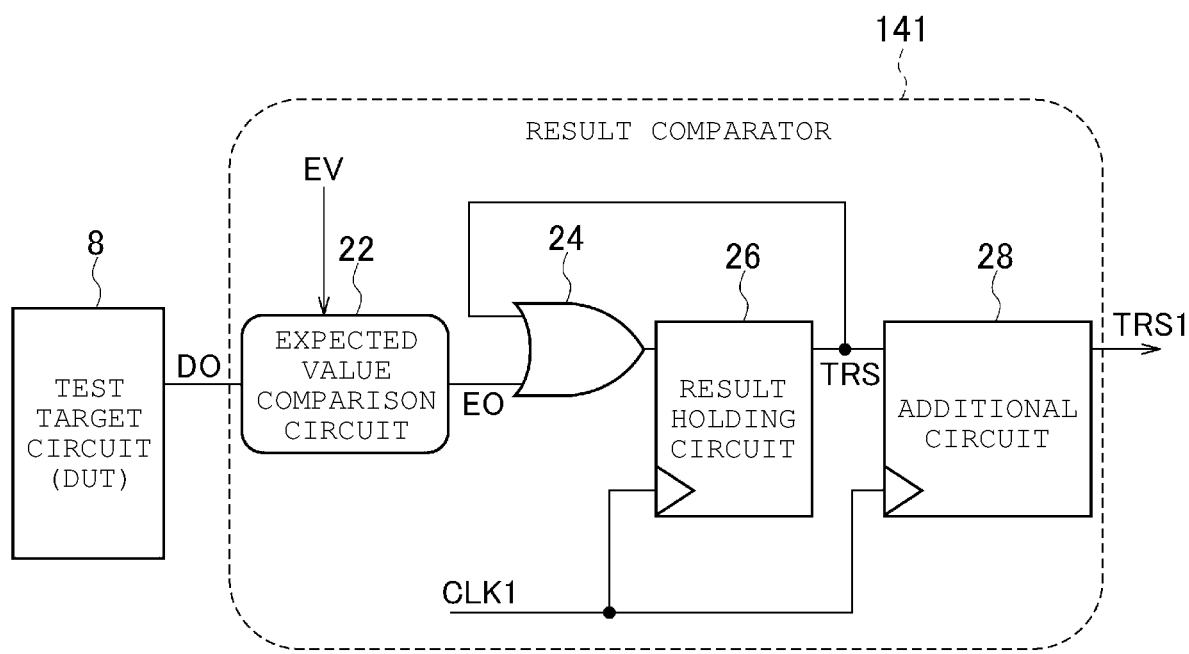
FIG. 4B is a circuit block diagram of a result comparator according to a first embodiment.

FIG. 4A shows a circuit block diagram of a semiconductor integrated circuit device 2 according to the first embodiment. FIG. 4B is a circuit block diagram of a result comparator 141 according to the first embodiment.

In the semiconductor integrated circuit device 2, a result comparator 141 is provided instead of the result comparator 14 of the comparative example. A test result signal TRS1 is output from the result comparator 141.

As shown in FIG. 4B, the result comparator 141 according to the first embodiment includes an expected value comparison circuit 22 that can be connected to a DUT 8, an OR gate 24 that is connected to the expected value comparison circuit 22, a result holding circuit 26 that is connected to the OR gate 24 and whose initial value is set to the low level L (value "0"), and an additional circuit 28 that is connected to the result holding circuit 26 and whose initial value is set to the high level H (value "1"). The result holding circuit 26 and the additional circuit 28 may include, for example, a flip-flop circuit configuration, such as a D-type flip-flop.

The test result signal TRS, which is the output of the result holding circuit 26, is input to the additional circuit 28. The additional circuit 28 outputs a test result signal TRS1 to the BIST circuit 6 or more particularly the control circuit 12 of the BIST circuit 6 in response to the input of the first clock signal CLK1. When the test result signal TRS1 is the low level L (value "0"), the control circuit 12 determines that the DUT 8 had no problem and that the test has been performed normally. When the test result signal TRS1 is the high level H (value "1"), the control circuit 12 determines that either there is a problem in the DUT 8 or the test has not been performed normally.

Figure 5B:
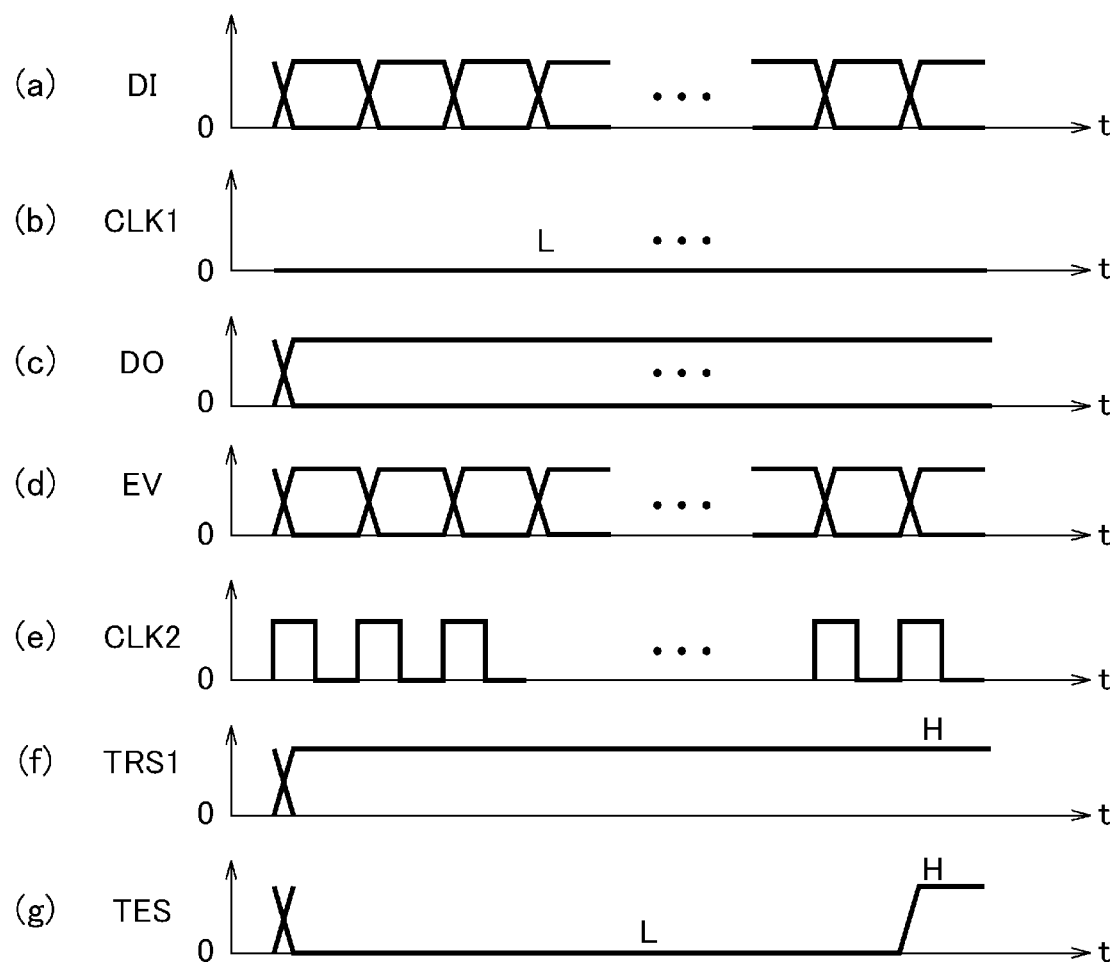
FIG. 5B is an operation timing chart of a semiconductor integrated circuit device in a case where a clock line of a device-under-test (DUT) fails according to a first embodiment.

FIG. 5A is an operation timing chart of the semiconductor integrated circuit device 2 in normal operation according to the first embodiment. FIG. 5B is an operation timing chart of the semiconductor integrated circuit device 2 in a case where the first clock line to the DUT 8 and the result comparator 141 fail.

In FIGS. 5A and 5B, portion (a) indicates the input data DI, portion (b) indicates the first clock signal CLK1, portion (c) indicates the output data DO, portion (d) indicates the expected value data EV, portion (e) indicates the second clock signal CLK2, portion (f) indicates the test result signal TRS1, and portion (g) indicates the test end signal TES.

Example when the result comparator 141 operates normally and there is no problem in the DUT 8
(Operation Timing Chart: FIG. 5A)

Initially, the result comparator 141 outputs an initial value H as the test result signal TRS1. After the start of the test, when the output data DO of the DUT 8 and the expected value data EV match with each other, the low level L of the result holding circuit 26 is input to the additional circuit 28, the additional circuit 28 is thus switched to low level L, and the test result signal TRS1 outputs as the low level L. After that, while the output data DO of the DUT 8 and the expected value data EV match with each other, the test result signal TRS1 continues to hold the low level L as shown by the solid line. The test end signal TES holds the low level L during the test, but it shifts from the low level L to the high level H when the test is completed. The control circuit 12 determines whether the DUT 8 has a problem or the test has been performed normally based on the test result signal TRS1. Since the test result signal TRS1 is the low level L at the end of the test, it is determined that there is no problem in the DUT 8 and that the DUT 8 has passed the test.

Example hen the result comparator operates 141 normally and there is a problem in the DUT 8
(Operation Timing Chart: FIG. 5A)

During the period of time when the output data DO of the DUT 8 and the expected value data EV match with each other, the test result signal TRS1 continues to hold the low level L. For example, in the region shown by the broken line A in FIG. 5A. However, if the DUT 8 is defective and the output data DO of the DUT 8 and the expected value data EV do not match, the test result signal TRS1 becomes the high level H as shown by the broken line and continues to hold this high level H. The test end signal TES holds the low level L during the test, but it shifts from the low level L to the high level H when the test is completed. The control circuit 12 determines whether the DUT 8 has a problem or the test has been performed normally based on the test result signal TRS1. Since the test result signal TRS1 is the high level H at the end of the test, it is determined that either there is a problem in the DUT 8 or that the test has not been performed normally. In any event, the test of the DUT 8 is indicated as a failure.

Example when the result comparator 141 does not operate normally
(When the Clock Line Fails: FIG. 5B)

When the first clock line to the DUT 8 fails, the first clock signal CLK1 to the DUT 8 becomes (or appears to be) the low level L as shown in portion (b) of FIG. 5B. Similarly, the first clock signal CLK1 to the result comparator 141 becomes (or appears to be) the low level L. Since the operation of both the DUT 8 and the result comparator 141 is stopped, the test result signal TRS1 from the result comparator 141 continues to output the initial value ("1") of the additional circuit 28, that is the high level H. The test end signal TES holds the low level L during the test, but it shifts from the low level L to the high level H when the test is completed. The control circuit 12 determines whether the DUT 8 has a problem or the test has been performed normally based on the test result signal TRS1. Since the test result signal TRS1 is the high level H at the end of the test, it is determined that either there is a problem in the DUT 8 or the test has not been performed normally. In any event, the test of the DUT 8 is indicated as a failure.

(Effect of First Embodiment)

In the first embodiment, even if the first clock line to the DUT 8 fails, it is possible to at least determine there is a problem with the testing of a DUT 8, that is the DUT 8 has a fault or the testing of the DUT 8 was not performed normally. Therefore, it is possible to prevent a test omission.

(Second Embodiment)

Figure 6A:
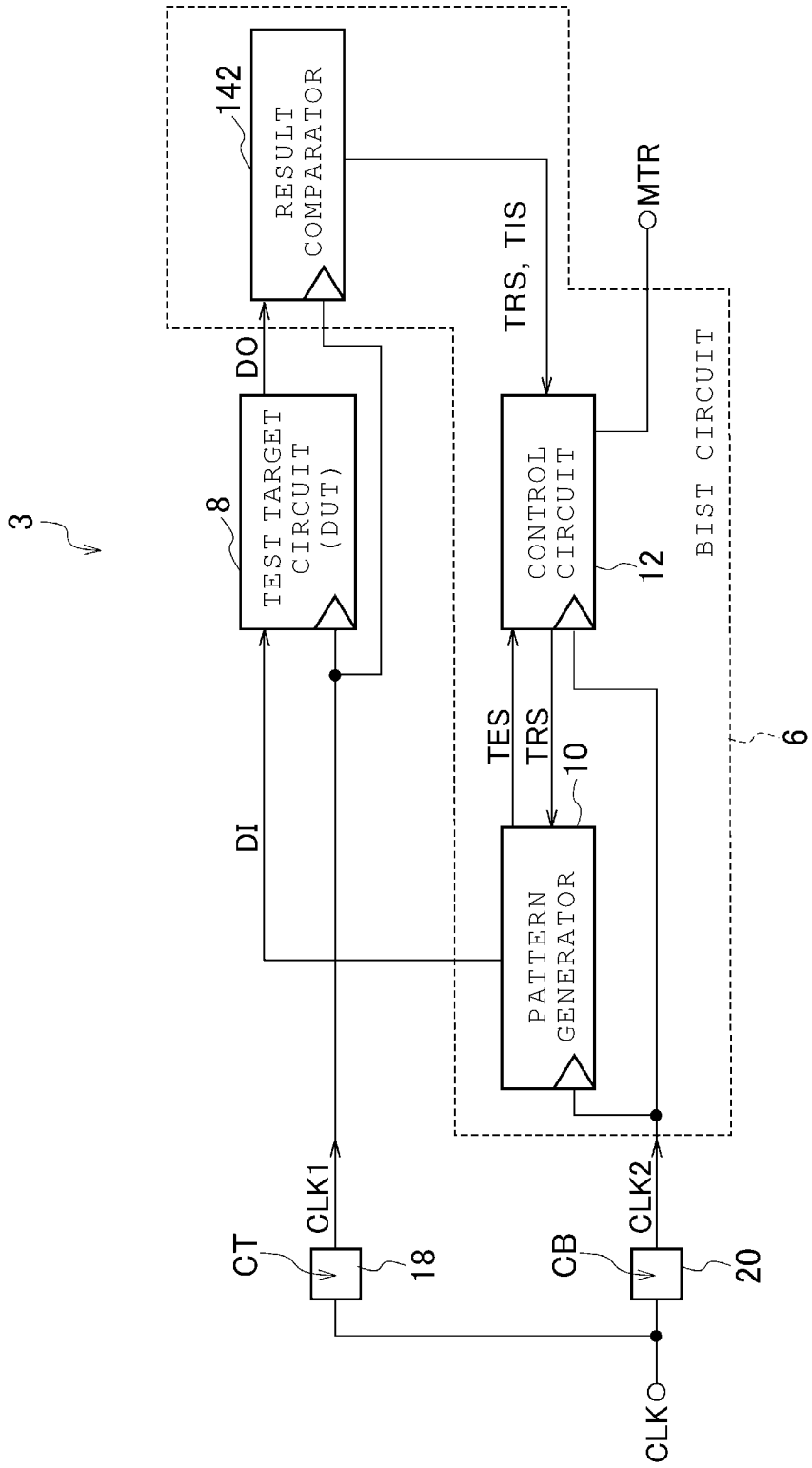
FIG. 6A is a circuit block diagram of a semiconductor integrated circuit device according to a second embodiment.
Figure 6B:
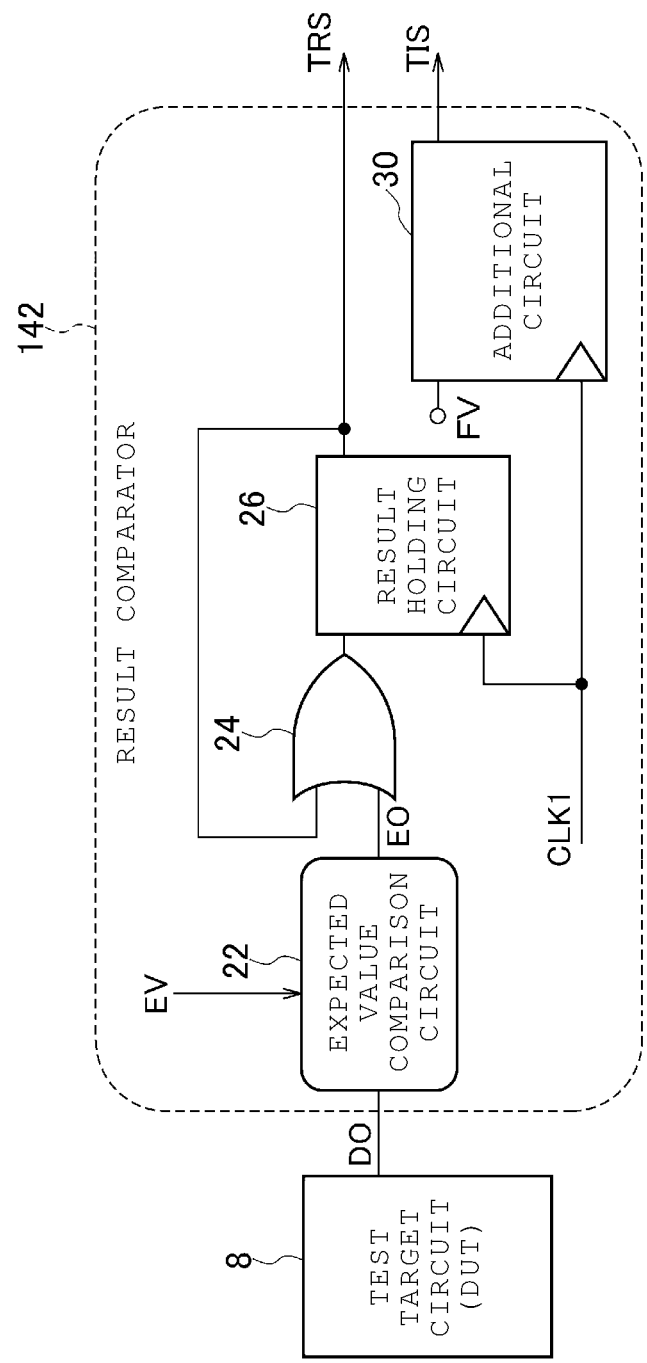
FIG. 6B is a circuit block diagram of a result comparator according to a second embodiment.

FIG. 6A shows a circuit block diagram of a semiconductor integrated circuit device 3 according to the second embodiment. FIG. 6B is a circuit block diagram of a result comparator 142 according to the second embodiment.

In the semiconductor integrated circuit device 3, the result comparator 142 is provided instead of the result comparator 141 of the first embodiment. The test result signal TRS and an additional circuit output signal TIS are output from the result comparator 142.

As shown in FIG. 6B, the result comparator 142 according to the second embodiment includes an expected value comparison circuit 22 that can be connected to a DUT 8, an OR gate 24 that is connected to the expected value comparison circuit 22, a result holding circuit 26 that is connected to the OR gate 24 (the initial value of the result holding circuit 26 is the low level L ("0")), and an additional circuit 30 that is disposed in parallel with the result holding circuit 26 (the initial value of additional circuit 30 is set to level L ("0")). A signal FV (fixed value) which is the inverse of the initial value of the result holding circuit 26 may be input to the additional circuit 30. That is, signal FV is set to level H ("1").

The output of the OR gate 24 is input to the result holding circuit 26. The result holding circuit 26 outputs the test result signal TRS in response to the input of the first clock signal CLK1. The output of the OR gate 24 is the OR output of the expected value comparison data EO and the test result signal TRS.

The signal FV (fixed value) being the inverted initial value of the result holding circuit 26 is input to the additional circuit 30, and the value is latched and output as the additional circuit output signal TIS.

Similarly to the result holding circuit 26, the additional circuit 30 may include a flip-flop circuit configuration, such as a D-type flip-flop. When the test result signal TRS is the low level L and the additional circuit output signal TIS is the high level H, the control circuit 12 determines that there is no problem in the DUT 8 and that the test has been performed normally. If the test result signal TRS is the high level H and the additional circuit output signal TIS is the high level H, the control circuit 12 determines that there is a problem in the DUT 8 but that at least the test has been performed normally. If the additional circuit output signal TIS is the low level L, the control circuit 12 determines that the test has not been performed normally.

Figure 7B:
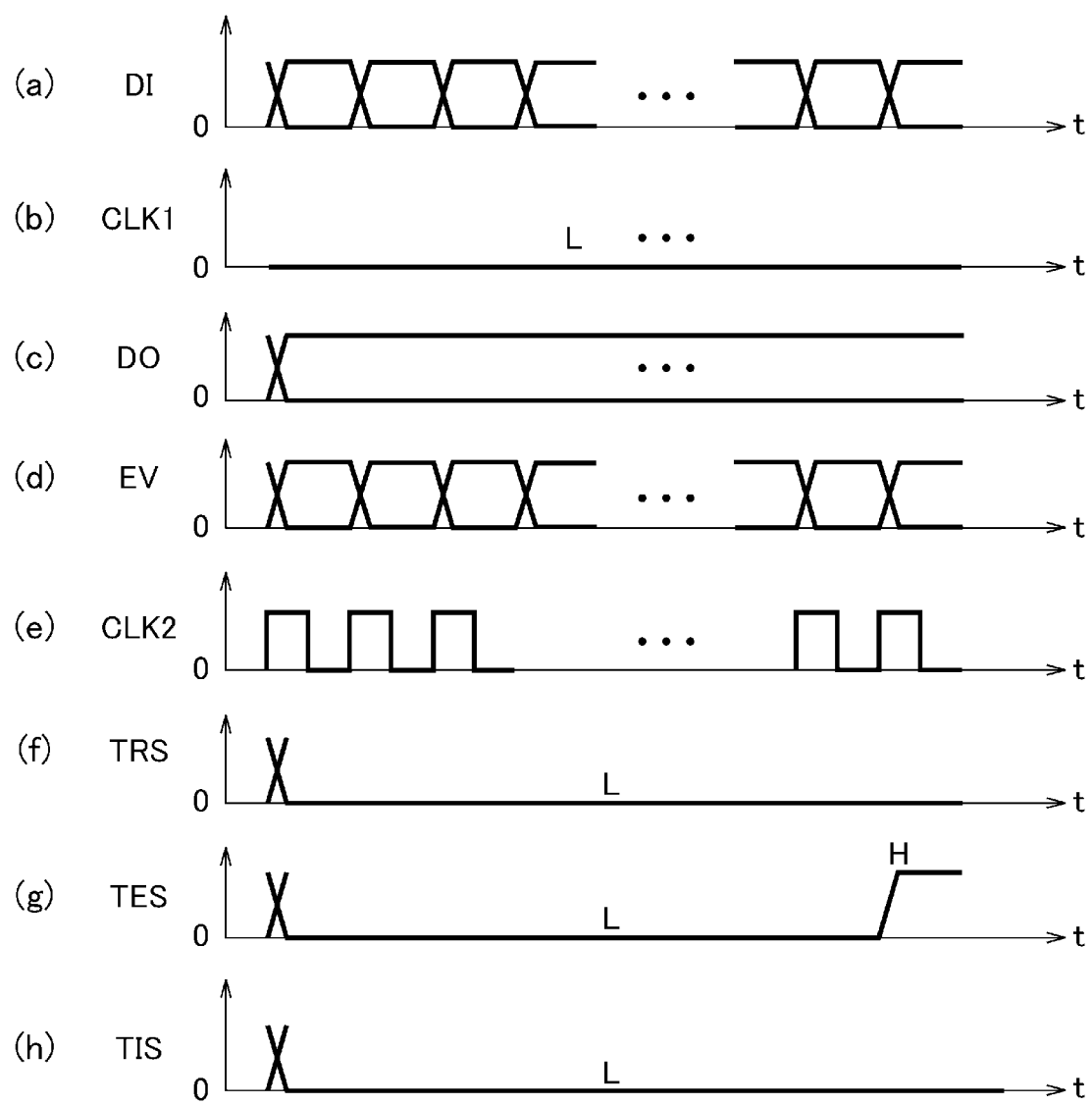
FIG. 7B is an operation timing chart of a semiconductor integrated circuit device in a case where a clock line of a device-under-test (DUT) fails according to a second embodiment.

FIG. 7A is an operation timing chart of the semiconductor integrated circuit device 3 in normal operation. FIG. 7B is an operation timing chart of the semiconductor integrated circuit device 3 in a case where the first clock line to the DUT 8 and the result comparator 142 fails.

In FIGS. 7A and 7B, portion (a) indicates the input data DI, portion (b) indicates the first clock signal CLK1, portion (c) indicates the output data DO, portion (d) indicates the expected value data EV, portion (e) indicates the second clock signal CLK2, portion (f) indicates the test result signal TRS, portion (g) indicates the test end signal TES, and portion (h) indicates the additional circuit output signal TIS.

Example when the result comparator 142 operates normally and there is no problem in the DUT 8

(Operation Timing Chart: FIG. 7A)

In the result comparator 142, after the start of the test, the high level H ("1"), which is an inverted signal of the initial value "0" of the result holding circuit 26, is input to the additional circuit 30 as signal FV, and thereafter, the high level H value is continuously output as the additional circuit output signal TIS. When the output data DO of the DUT 8 and the expected value data EV match with each other, the result holding circuit 26 outputs the low level L as the test result signal TRS, and thereafter, the test result signal TRS continues to hold the low level L as shown by the solid line while the output data DO of the DUT 8 and the expected value data EV continue to match. The test end signal TES holds the low level L during the test, but it shifts from the low level L to the high level H when the test is completed. The control circuit 12 now determines whether the DUT 8 has a problem or the test has not been performed normally. Since the test result signal TRS is the low level L and the additional circuit output signal TIS is the high level H at the end of the test, it is determined that there is no problem in the DUT 8 and the test has been performed normally and that the DUT 8 has passed the test.

Example when the result comparator 142 operates normally and there is a problem in the DUT 8

(Operation Timing Chart: FIG. 7A)

In the result comparator 142, after the start of the test, the high level H ("1"), which is an inverted signal of the initial value "0" of the result holding circuit 26, is input to the additional circuit 30, and this value is continuously output as the additional circuit output signal TIS. While the output data DO of the DUT 8 and the expected value data EV match with each other, the test result signal TRS continues to hold the low level L. For example, it is the region shown by the broken line A in FIG. 7A. However, if the DUT 8 is defective and the output data DO of the DUT 8 and the expected value data EV do not match with each other, the test result signal TRS becomes the high level H as shown by the broken line and continues to hold this high level H. The test end signal TES holds the low level L during the test, but it shifts from the low level L to the high level H when the test is completed. The control circuit 12 now determines whether the DUT 8 has a problem or the test has not been performed normally. Since the test result signal TRS is the high level H and the additional circuit output signal TIS is the high level H at the end of the test, it is determined that there is a problem in the DUT 8 but the test has been performed normally and that the DUT 8 has failed the test.

Example when the result comparator 142 does not operate normally (When the Clock Line Fails: FIG. 7B)

When the clock line to the DUT 8 fails, the first clock signal CLK1 to the DUT 8 is (or appears to be) always the low level L as shown in portion (b) of FIG. 7B. Similarly, the first clock signal CLK1 supplied to the result comparator 142 also becomes the low level L. Since the operation of both the DUT 8 and the result comparator 142 is stopped, the additional circuit output signal TIS from the result comparator 142 continues as the initial value 0 of the additional circuit 30 (rather than the signal FV from the result holding circuit 26), that is the low level L. The test result signal TRS also continues to output the initial value 0 of the result holding circuit 26, that is the low level L. The test end signal TES holds the low level L during the test, but it shifts from the low level L to the high level H when the test is completed. The control circuit 12 now determines whether the DUT 8 has a problem or the test has not been performed normally. Since the additional circuit output signal TIS is the low level L at the end of the test, it is determined that the test has not been performed normally regardless of the value of the test result signal TRS and that the DUT 8 test fails.

(Effect of Second Embodiment)

In the second embodiment, when it is determined that the test indicates a failure, it is possible to further distinguish between (i) there being a problem in the DUT 8 and (ii) the testing itself not being performed normally.

(Third Embodiment)

Figure 8A:
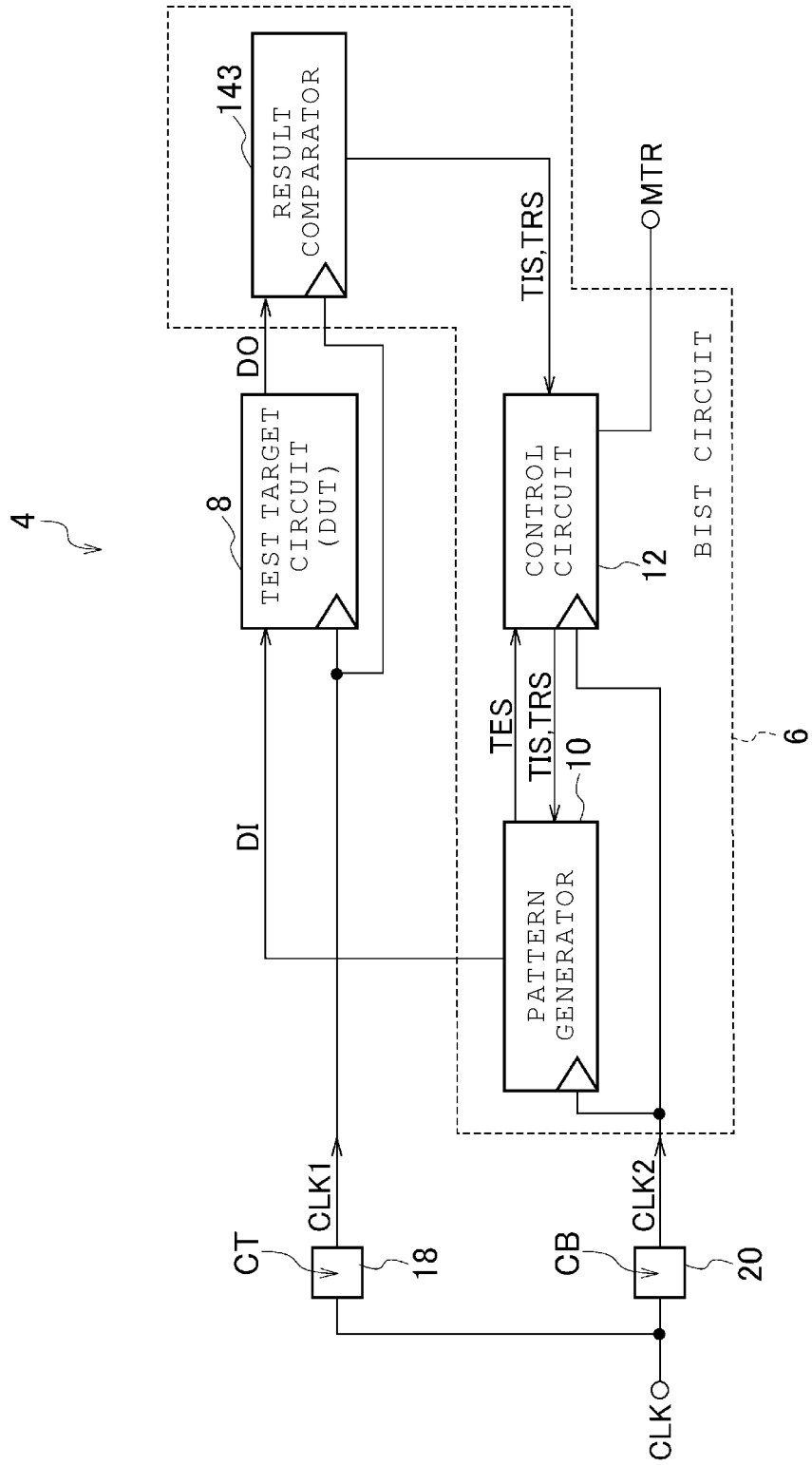
FIG. 8A is a circuit block diagram of a semiconductor integrated circuit device according to a third embodiment.
Figure 8B:
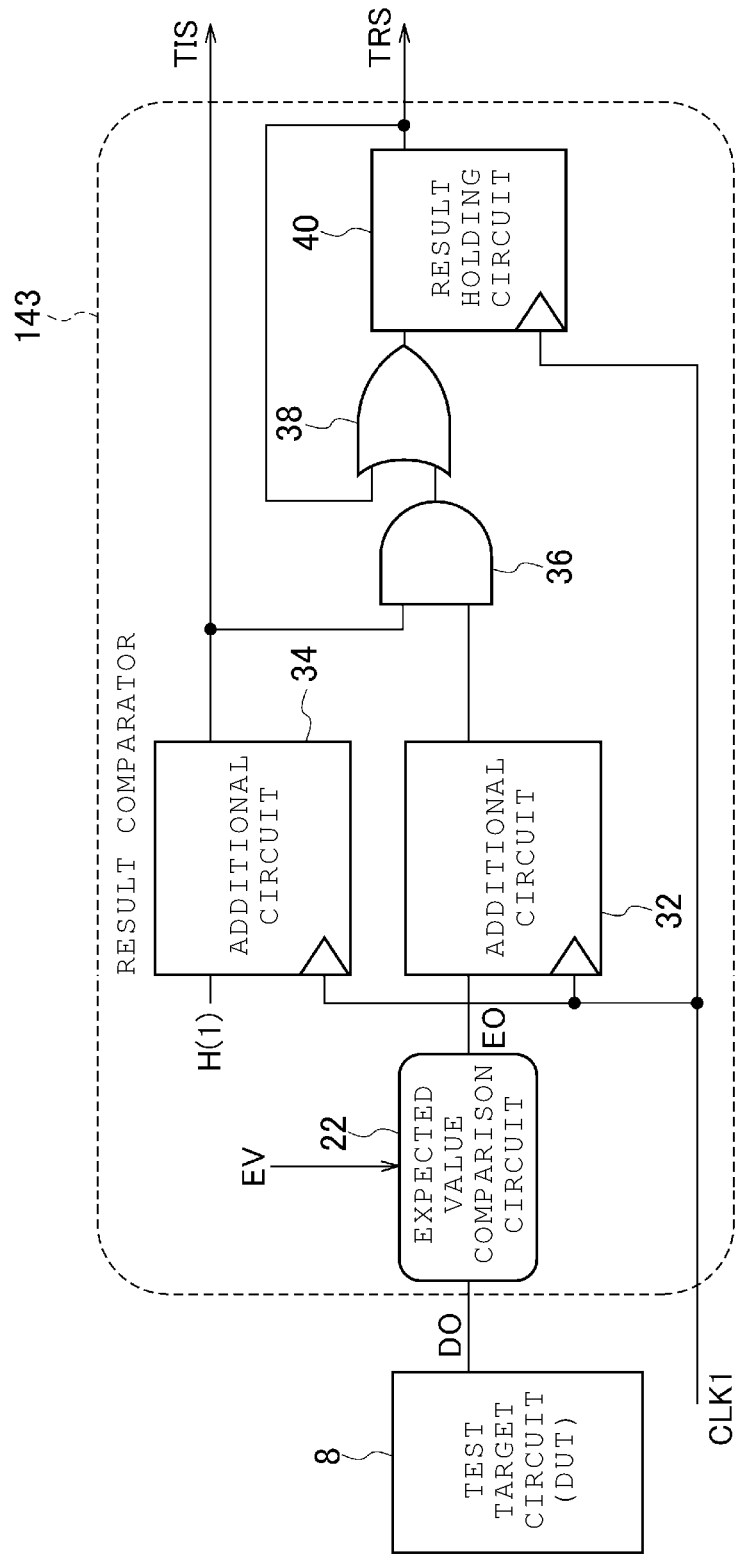
FIG. 8B is a circuit block diagram of a result comparator according to a third embodiment.

FIG. 8A shows a circuit block diagram of a semiconductor integrated circuit device 4 according to the third embodiment. FIG. 8B is a circuit block diagram of a result comparator 143 according to the third embodiment.

In the semiconductor integrated circuit device 4, the result comparator 143 is provided instead of the result comparator 141 of the first embodiment and the result comparator 142 of the second embodiment. The test result signal TRS and the additional circuit output signal TIS are output from the result comparator 143.

As shown in FIG. 8B, the result comparator 143 according to the third embodiment includes an expected value comparison circuit 22 that can be connected to the DUT 8, an additional circuit 32 that is connected to the expected value comparison circuit 22 and whose initial value is set to the high level H ("1"), another additional circuit 34 whose initial value is set to the low level L ("0"), an AND gate 36 that is connected to both the additional circuit 32 and the additional circuit 34, an OR gate 38 that is connected to the AND gate 36, and a result holding circuit 40 that is connected to the OR gate 38 and whose initial value is set to the low level L ("0"). The output of the result holding circuit 40 is further connected to the OR gate 38. When the test is started, the high level H ("1") is input to the additional circuit 34. Each of the additional circuit 32, the additional circuit 34, and the result holding circuit 40 includes a flip-flop circuit configuration, such as a D-type flip-flop. The first clock signal CLK1 is input to the additional circuit 32, the additional circuit 34, and the result holding circuit 40.

The expected value comparison circuit 22 compares the output data DO of the DUT 8 with the expected value data EV and outputs the expected value comparison data EO. The expected value comparison data EO is input to the additional circuit 32.

The output of the additional circuit 32 is input to the AND gate 36. The output of the additional circuit 34 is also input to the AND gate 36. The AND gate 36 outputs the logical product of the expected value comparison data EO and the additional circuit 34. The additional circuit 34 also outputs an additional circuit output signal TIS. By observing the additional circuit output signal TIS, the operating state of the result comparator 143 can be determined. If the test is normally started, the additional circuit output signal TIS changes from the low level L ("0") to the high level H ("1").

The output of the additional circuit 34 is input to the AND gate 36. The output of the AND gate 36 is input to the OR gate 38. The output of the OR gate 38 is input to the result holding circuit 40. The result holding circuit 40 outputs the test result signal TRS in response to the input of the first clock signal CLK1. The test result signal TRS is also input to the OR gate 38. That is, the output of the OR gate 38 becomes the OR output of the output of the AND gate 36 and the test result signal TRS.

If the test result signal TRS is the low level L and the additional circuit output signal TIS is the high level H, the control circuit 12 determines that there is no problem in the DUT 8 and that the test has been performed normally. If the test result signal TRS is the high level H and the additional circuit output signal TIS is the high level H, the control circuit 12 determines that there is a problem in the DUT 8 but the test has been performed normally. If the additional circuit output signal TIS is the low level L, the control circuit 12 determines that the test has not been performed normally.

Figure 9A:
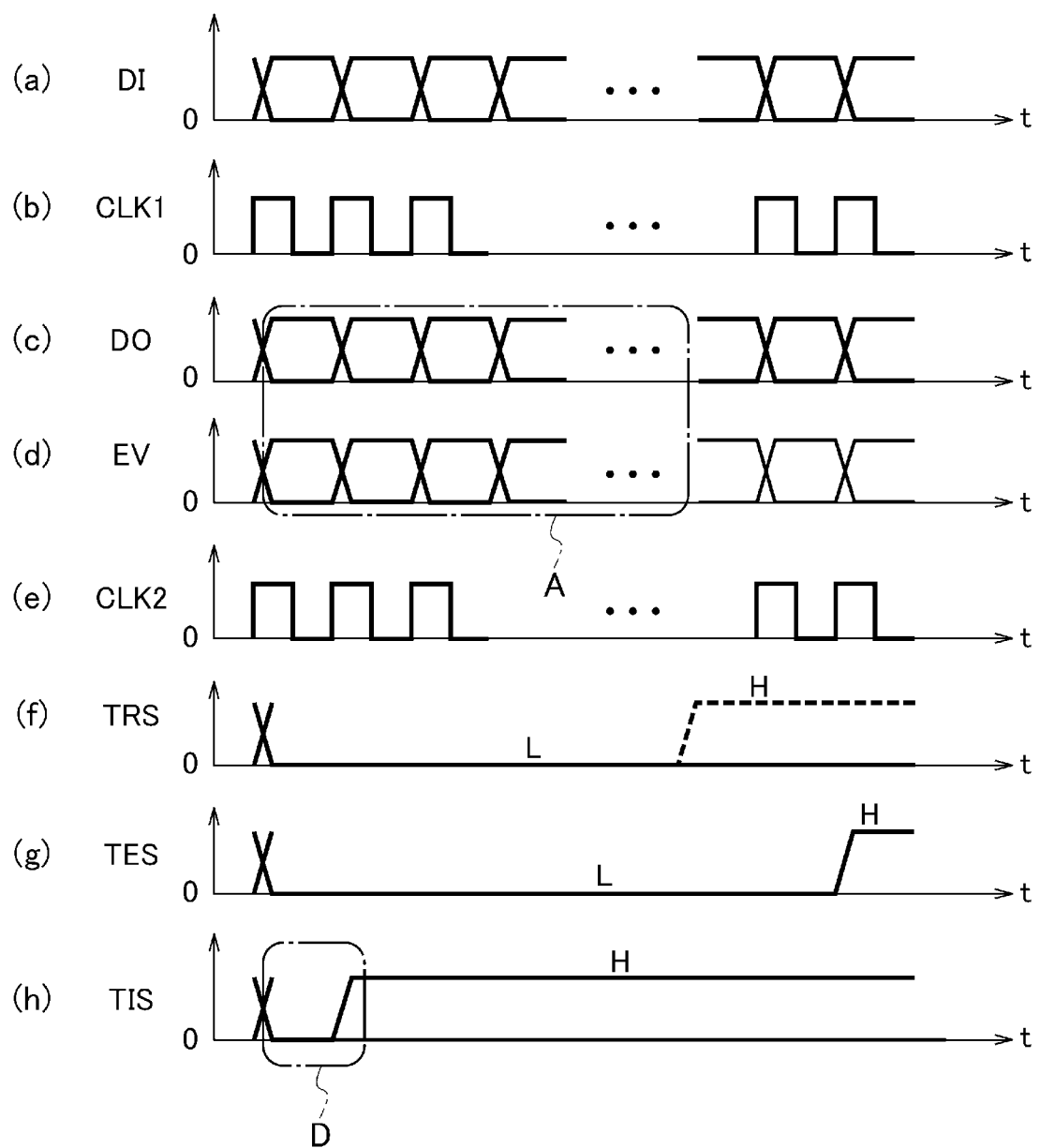
FIG. 9A is an operation timing chart of a semiconductor integrated circuit device in normal operation according to a third embodiment.

FIG. 9A is operation timing chart of the semiconductor integrated circuit 4 in normal operation. FIG. 9B is an operation timing chart of the semiconductor integrated circuit 4 in a case where the clock line to the DUT 8 fails.

In FIGS. 9A and 9B, portion (a) indicates the input data DI, portion (b) indicates the first clock signal CLK1, portion (c) indicates the output data DO, portion (d) indicates the expected value data EV, portion (e) indicates the second clock signal CLK2, portion (f) indicates the test result signal TRS, portion (g) indicates the test end signal TES, and portion (h) indicates the additional circuit output signal TIS.

Example when the result comparator 143 operates normally and there is no problem in the DUT 8
(Operation Timing Chart: FIG. 9A)

In the result comparator 143, after the start of the test, the high level H ("1") is input to the additional circuit 34 in the period indicated by the broken line D, and thereafter, the value is continuously output as the additional circuit output signal TIS. When the output data DO of the DUT 8 and the expected value data EV match with each other, the expected value comparison circuit 22 outputs the low level L, and the additional circuit 32 output becomes the low level L. The high level H output from the additional circuit 34 and the low level L output from the additional circuit 32 are input to the AND circuit 36. The output of the AND circuit 36 becomes the low level L and is input to the OR circuit 38. The output from the result holding circuit 40 whose initial value is the low level L is input to the OR circuit 38, and as a result, the output of the OR circuit 38 becomes the low level L and is input to the result holding circuit 40. In this way, the test result signal TRS from the result holding circuit 40 continues to hold the low level L as shown by the solid line while the output data DO of the DUT 8 and the expected value data EV match. The test end signal TES holds the low level L during the test, but it shifts from the low level L to the high level H when the test is completed. The control circuit 12 determines whether the DUT 8 has a problem or the test has been performed normally. Since the test result signal TRS is the low level L and the additional circuit output signal TIS is the high level H at the end of the test, it is determined that there is no problem in the DUT 8 and the test has been performed normally and that the DUT 8 has passed the test.

Example when the result comparator operates 143 normally and there is a problem in the DUT 8
(Operation Timing Chart: FIG. 9A)

In the result comparator 143, after the start of the test, the high level H ("1") is input to the additional circuit 34, and thereafter, the value is continuously output as the additional circuit output signal TIS. When the output data DO of the DUT 8 and the expected value data EV match with each other, the expected value comparison circuit 22 outputs the low level L, and the additional circuit 32 becomes the low level L. The high level H output from the additional circuit 34 and the low level L output from the additional circuit 32 are input to the AND circuit 36. The output of the AND circuit 36 becomes the low level L and is input to the OR circuit 38. The output from the result holding circuit 40 whose initial value is the low level L is input to the OR circuit 38, and as a result, the output of the OR circuit 38 becomes the low level L and is input to the result holding circuit 40. The test result signal TRS from the result holding circuit 40 continues to hold the low level L while the output data DO of the DUT 8 and the expected value data EV match. For example, it is the range shown by the broken line A in FIG. 9A. However, if there is a problem in the DUT 8 and the output data DO of the DUT 8 and the expected value data EV do not match, the output from the expected value comparison circuit 22 becomes the high level H. The value of the additional circuit 32 becomes the high level H. As a result, the output of the AND circuit 36 becomes the high level H and the output of the OR circuit 38 also becomes the high level H. The result holding circuit 40 also becomes the high level H, and thereafter, the test result signal TRS becomes the high level H as shown by the broken line and continues to hold this high level H. The test end signal TES holds the low level L during the test, but it shifts from the low level L to the high level H when the test is completed. The control circuit 12 then determines whether the DUT 8 has a problem or the test has not been performed normally. Since the test result signal TRS is the high level H and the additional circuit output signal TIS is the high level H at the end of the test, it is determined that there is a problem in the DUT 8 and the test has been performed normally.

Example when the result comparator 143 does not operate normally
(When the Clock Line Fails: FIG. 9B)

When the clock line to the DUT 8 fails, the first clock signal CLK1 to the DUT 8 becomes the low level L as shown in (b) of FIG. 9B. The additional circuit output signal TIS continues to output the low level L, which is the initial value of the additional circuit 34. The test result signal TRS continues to output the low level L, which is the initial value of the result holding circuit 40. The test end signal TES holds the low level L during the test, but it shifts from the low level L to the high level H when the test is completed. The control circuit 12 then determines whether the DUT 8 has a problem or the test has not been performed normally. Since the additional circuit output signal TIS is the low level L at the end of the test, it is determined that the test has not been performed normally regardless of the value of the test result signal TRS.

(Effect of Third Embodiment)

The same or substantially the same effect as that of the second embodiment can be obtained in the third embodiment.

While certain embodiments have been described, these embodiments have been presented by way of example only and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor integrated circuit device, comprising:
   a pattern generator configured to supply input data to a device-under-test;
   a result comparator configured to compare output data from the device-under-test with expected value data and output a test result signal;
   a control circuit that controls the pattern generator and the result comparator, wherein
   the device-under-test and the result comparator are connected to a first clock line, and
   the pattern generator and the control circuit are connected to a second clock line different from the first clock line,
   the result comparator comprises:
      an expected value comparison circuit configured to compare the output data of the device-under-test with the expected value data and output expected value comparison data;
      a result holding circuit configured to hold the expected value comparison data from the expected value comparison circuit and output the test result signal; and
      a second additional circuit connected to the first clock line and configured to receive a first signal related to the result holding circuit and output an additional circuit output signal, an initial state of the second additional circuit being a state in which the additional circuit output signal is output at a first signal level, and
   the control circuit is further configured to:
      determine that the test has not been performed normally if the additional circuit output signal from the result comparator is the first signal level at the end of the test,
      determine that the test has been performed normally and that the device-under-test has passed the test if the additional circuit output signal from the result comparator is a second signal level different from the first signal level at the end of the test and the test result signal from the result comparator is the first signal level, and
      determine that the test has been performed normally and that the device-under-test has failed the test if the additional circuit output signal from the result comparator is the second signal level at the end of the test and the test result signal from the result comparator is the second signal level.

2. The semiconductor integrated circuit device according to claim 1, further comprising:
   an OR circuit configured to receive the test result signal of the result holding circuit and the expected value comparison data of the expected value comparison circuit and supply an OR output to the result holding circuit.

3. The semiconductor integrated circuit device according to claim 1, wherein the result holding circuit has an initial state in which the first signal level is output from the result holding circuit.

4. The semiconductor integrated circuit device according to claim 1, wherein the control circuit includes a monitor terminal for observing the test result signal.

5. The semiconductor integrated circuit device according to claim 1, wherein the device-under-test is in the semiconductor integrated circuit device.

6. A semiconductor integrated circuit device, comprising:
   a pattern generator configured to supply input data to a device-under-test;
   a result comparator configured to compare output data from the device-under-test with expected value data and output a test result signal; and
   a control circuit that controls the pattern generator and the result comparator, wherein
   the device-under-test and the result comparator are connected to a first clock line,
   the pattern generator and the control circuit are connected to a second clock line different from the first clock line,
   the result comparator comprises:
      an expected value comparison circuit configured to compare the output data of the device-under-test with the expected value data and output expected value comparison data;
      a third additional circuit connected to an output of the expected value comparison circuit;
      a fourth additional circuit configured to output an additional circuit output signal, the fourth additional circuit having an initial state in which the first signal level is output as the additional circuit output signal, and the additional circuit output signal transitioning to the second signal level after the start of the test; and
      a result holding circuit connected to an output the third additional circuit and configured to output the test result signal, and
   the control circuit is further configured to:
      determine that the test has been performed normally and that the device-under-test has passed the test if the additional circuit output signal is the second signal level at the end of the test and the test result signal from the result comparator is the first signal level;
      determine that the test has been performed normally and that the device-under-test has failed the test if the additional circuit output signal is the second signal level at the end of the test and the test result signal from the result comparator is the second signal level; and
      determine that the test has not been performed normally if the additional circuit output signal is the first signal level at the end of the test.

7. The semiconductor integrated circuit device according to claim 6, further comprising:
   an AND circuit configured to receive the output of the third additional circuit and the additional circuit output signal of the fourth additional circuit; and
   an OR circuit configured to receive the test result signal of the result holding circuit and an output of the AND circuit and supply an OR output to the result holding circuit.

8. The semiconductor integrated circuit device according to claim 6, wherein the result holding circuit has an initial state in which the first signal level is output as the test result signal.

9. The semiconductor integrated circuit device according to claim 6, wherein the control circuit includes a monitor terminal for observing the test result signal.

10. The semiconductor integrated circuit device according to claim 6, wherein the device-under-test is in the semiconductor integrated circuit device.

11. An operating method for a semiconductor integrated circuit device, the method comprising:
   comparing output data of a device-under-test and expected value data in an expected value comparison circuit;
   holding a result of the comparing in a result holding circuit;
   outputting a test result signal from the result holding circuit;
   outputting an additional circuit output signal from an additional circuit, the additional circuit output signal being based on at least one of the test result signal and a first signal related to the result holding circuit;
   determining that a test has not been performed normally if the additional circuit output signal is a first signal level at the end of the test;
   determining that the test has been performed normally and that the device-under-test has passed the test if the additional circuit output signal is a second signal level, different from the first signal level, at the end of the test and the test result signal is the first signal level at the end of the test; and
   determining that the test has been performed normally and that the device-under-test has failed the test if the additional circuit output signal is the second signal level at the end of the test and the test result signal is the second signal level at the end of the test.

12. The operating method according to claim 11, further comprising:
   setting an initial state of the result holding circuit to a state in which the first signal level is generated.

13. The operating method according to claim 11, further comprising:
   outputting the test result signal to a monitor terminal.

* * * * *